United States Patent [19]
Rahman et al.

[11] Patent Number: 5,928,836
[45] Date of Patent: Jul. 27, 1999

[54] FRACTIONATED NOVOLAK RESIN COPOLYMER AND PHOTORESIST COMPOSITION THEREFROM

[75] Inventors: M. Dalil Rahman, Flemington; Stanley F. Wanat, Scotch Plains; Michelle M. Cook, Somerville, all of N.J.; Douglas S. McKenzie, Easton, Pa.; Sunit S. Dixit, Flemington, N.J.

[73] Assignee: Clariant Finance (BVI) Limited, Tortola, Virgin Islands (Br.)

[21] Appl. No.: 08/939,451

[22] Filed: Sep. 29, 1997

[51] Int. Cl.$^6$ ........................................................ G03C 1/72
[52] U.S. Cl. ........................ 430/270.1; 430/311; 430/905; 430/168; 525/491; 528/144; 528/501; 528/203
[58] Field of Search ...................................... 528/144, 501, 528/203; 430/220.1, 311, 905, 168, 169, 192; 525/491

[56] References Cited

U.S. PATENT DOCUMENTS

| | | | |
|---|---|---|---|
| 4,345,054 | 8/1982 | Takeda et al. | 525/480 |
| 4,876,324 | 10/1989 | Nakano et al. | 528/142 |
| 5,130,410 | 7/1992 | Zampini et al. | 528/218 |
| 5,665,517 | 9/1997 | Rahman et al. | 430/270.1 |

*Primary Examiner*—Janet Baxter
*Assistant Examiner*—Yvette M. Clarke
*Attorney, Agent, or Firm*—Andrew F. Sayko, Jr.

[57] ABSTRACT

The present invention provides a method for producing a film forming, fractionated novolak resin copolymer exhibiting fast photospeed and superior performance in a photoresist composition. A method is also provided for producing photoresist composition from such a fractionated novolak resin copolymer and for producing semiconductor devices using such a photoresist composition.

15 Claims, No Drawings

FRACTIONATED NOVOLAK RESIN COPOLYMER AND PHOTORESIST COMPOSITION THEREFROM

BACKGROUND OF THE INVENTION

The present invention relates to a process for producing a film forming fractionated novolak resin exhibiting fast photospeed in light sensitive compositions useful as photoresists, and for using such a novolak resin in light-sensitive positive-working photoresists. Further, the present invention relates to a process for coating substrates with these light-sensitive compositions, as well as the process of coating, imaging and developing these light-sensitive mixtures on such substrates.

Photoresist compositions are used in microlithography processes for making miniaturized electronic components, such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Novolak resins are frequently used as polymeric film forming binders in liquid photoresist formulations. These resins are typically produced by conducting a condensation reaction between formaldehyde and one or more multi-substituted phenols, in the presence of an acid catalyst, such as oxalic acid, maleic acid, or maleic anhydride.

In producing sophisticated semiconductor devices, it has become increasingly important to provide a film forming novolak resin of superior quality in terms of faster photospeed and heat resistance in addition to the other functional properties expected of resist coatings.

There are two types of photoresist compositions, negative-working and positive-working. When negative-working photoresist compositions are exposed image-wise to radiation, the areas of the resist composition exposed to the radiation become less soluble in a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble in the developer solution (e.g. a rearrangement reaction occurs) while those areas not exposed remain relatively insoluble in the developer. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions. It is at this stage that heat resistance is important since any softening of the coating causes unwanted distortions in the image area of the coated resist wafer.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

DESCRIPTION OF THE PRIOR ART

In recent years there has been significant progress in novolak resin synthesis and fractionation. It has been reported that under vigorous synthetic conditions the structure of novolak resin may change, especially when high concentration of acid catalyst and high temperature is used, Rahman et al, "Rearrangement of Novolak Resin", presented at the 1994 (International Society for Optical Engineering) SPIE conference; Khadim et al and "The Nature and Degree of Substitution Patterns in Novolaks by Carbon-13 NMR Spectroscopy" as presented at the 1993 SPIE conference. In a typical novolak reaction, a reactor is charged with phenolic compounds, an acid catalyst such as oxalic acid, maleic acid, p-toluene sulfonic acid or any mineral acid, and heated to about 95 to 100° C. Formaldehyde is slowly added and the mixture is heated at reflux for about 6 hours. At the end of the condensation period, the reactor is converted to distillation, and the temperature is raised to about 200° C. At this point vacuum is slowly drawn, the temperature is raised to about 220° C., and the pressure is reduced to below about 20 mm Hg. After the volatiles have been distilled off, the vacuum is released and the molten novolak resin collected and allowed to cool. During the course of this resin synthesis, samples are taken at various temperatures and inspected by GPC (Gel Permeation Chromatography). It was found that there was a decrease of the weight average molecular weight of the polymer, especially in the temperature range between about 160–190° C. (Rahman et al, "The Effect of Lewis Bases on the Molecular Weight of Novolak Resins", presented at the Ellenville Conference in 1994). The molecular weight decrease (partial depolymerization) was not observed unless the phenolic compounds are extremely pure. If the phenolic compounds contain a trace amount of a Lewis Base, such as a nitrogen base, the molecular weight decrease was not observed. In U.S. Pat. No. 5,476,750, assigned to the same assignee as the subject application and incorporated herein by reference, an improved process is disclosed to control molecular weight (avoid substantial depolymerization) by adjusting the amount of Lewis Base in the phenolic compounds before or after the condensation reaction. It was disclosed that during the purification process of such phenolic compounds using an ion exchange resin, distillation, and/or a solvent extraction process, to remove metal ions, the minor amount of Lewis Base present was also removed. Due to the absence of this base, the novolak resin was partially depolymerized during the manufacturing process. The resin changes caused by degradation rendered the material unusable for photoresist compositions. This problem can be substantially avoided by adjusting the level of Lewis Base before or after the condensation step of the novolak resin manufacturing process.

In copending U.S. patent application Ser. No. 366,634, filed on Dec. 30, 1994, (WO 96/21211 published Jul. 11, 1996) assigned to the same assignee as the subject application and incorporated herein by reference, an improved process is disclosed for isolating a novolak resin at a temperature less than about 140° C. by using subsurface forced steam distillation to avoid high temperature molecular weight breakdown of the resin. (Rahman et al, "Isolation of Novolak Resin at Low Temperature", presented at the 1996 SPIE Conference). It is known that a film forming novolak resin can be made by the condensation reaction of a mixture of phenolic monomers with an aldehyde source. Such novolak resin synthesis processes are disclosed in U.S. Pat. No. 5,346,799, incorporated herein by reference.

SUMMARY OF THE INVENTION

The present novolak resin synthesis process provides novolak resin fractions formed by the incorporation of resins, made from the condensation of multi-hydroxy substituted benzenes with aldehydes or ketones, during the condensation reaction of substituted phenols and formaldehyde under acidic conditions (typical phenol/formaldehyde reaction conditions forming novolak resins). A multi-hydroxy containing benzene, such as pyrogallol, resorcinol, 2-methyl resorcinol, 5-methyl resorcinol or 2,5-dimethyl resorcinol is first condensed with a ketone, such as acetone or methyl ethyl ketone, or an aldehyde, such as formaldehyde or acetaldehyde, under acid conditions. The resulting novolak resin copolymer is then fractionated by removing low molecular weight material and monomers by selective precipitation from a dilute polar organic solvent solution with deionized (DI) water. The resin copolymer which is formed is isolated as a solid, such as by utilizing a high temperature distillation process. The isolated solid resin copolymer is then dissolved in a water soluble organic polar solvent, such as acetone, dimethylformamide (DMF), dimethylsulfoxide (DMSO), tetrahydrofuran (THF), ethylene glycol or a $C_1$–$C_3$ alkyl alcohol, such as ethanol, propanol or, preferably, methanol. Deionized (DI) water, is then added, preferably at a ratio of water soluble organic polar solvent:deionized water ratio of from about 1:10 to about 10:1; thereby precipitating the novolak resin copolymer. The remaining solution is then separated from the precipitate, such as by suction or by siphoning off the remaining solution which contains low molecular weight novolak resin, and useless monomers and oligomers. To the novolak resin copolymer precipitate, a water soluble organic polar solvent is added to redissolve the solid copolymer and deionized water is then added, preferably at a water soluble organic polar solvent, deionized water ratio of from about 1:10 to about 10:1, to reprecipitate the copolymer, thereby further removing low molecular weight novolak resin. The remaining low molecular weight resin, phenols, and oligomers and monomers remain in the supernatant upper liquid phase where they are separated, such as by suction or by siphoning off the remaining solution. The high molecular weight novolak resin copolymer precipitate is then dissolved in a photoresist solvent, and any remaining water and organic polar solvent are removed, such as by distillation at low temperature under vacuum.

The photoresist solvent may comprise propylene glycol methyl ether acetate (PGMEA), 3-methoxy-3-methyl butanol (MMB), ethylene glycol monomethyl ether, ethylene glycol monoethyl ether, diethylene glycol monoethyl ether, ethylene glycol monoethyl ether acetate, ethylene glycol monomethyl acetate, 2-heptanone, methyl ethyl ketone or a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyactetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate (ethyl lactate—"EL"), ethyl 3-hydroxypropionate, propyl 2-oxypropionate, methyl 2-ethoxypropionate, propyl 2-methoxy propionate and 2-heptanone or mixtures of one or more of these solvents.

In the process of the present invention a film forming, fractionated novolak resin copolymer exhibiting fast photospeed in light sensitive photoresist compositions is obtained. The present invention provides a process for producing a such a fractionated, film forming novolak resin copolymer, which process comprises:

a) condensing formaldehyde with one or more phenolic compounds, in the presence of an acid catalyst, then incorporating a presynthesized polymer of a multi-hydroxy benzene with a ketone or aldehyde, and thereby producing a novolak resin copolymer with the multi-hydroxybenzene/ketone or aldehyde moiety incorporated as part of a block copolymer;

b) isolating the novolak resin copolymer from a) by removing the unreacted formaldehyde or phenolic compound monomers, such as by distilling off the unreacted monomers;

c) adding to the novolak resin copolymer from b) a water soluble organic polar solvent to provide a solution of from about 15 to about 40 weight percent copolymer, preferably from about 20 to about 30 weight percent; then adding deionized water, at a ratio of water soluble organic polar solvent, deionized water of from about 1:10 to about 10:1, preferably from about 2:8 to about 8:2, more preferably from about 3:7 to about 7:3 and most preferably from about 4:6 to about 6:4, and thereby precipitating the novolak resin copolymer and providing a solution of the remaining unreacted phenolic compounds, low molecular weight novolak resin, and useless monomers and oligomers;

d) removing, such as by decanting or by suction, the remaining solution from c);

e) adding a water soluble organic polar solvent to the precipitated novolak resin copolymer from c) and thereby providing a solution of from about 15 to about 40 weight percent copolymer, preferably from about 20 to about 30 weight percent; then adding deionized water, at a ratio of water soluble organic polar solvent-:deionized water of from about 1:10 to about 10:1, preferably from about 2:8 to about 8:2, more preferably from about 3:7 to about 7:3, and most preferably from about 4:6 to about 6:4, thereby again precipitating the novolak resin copolymer, and then removing, such as by decanting or by suction, the remaining solution;

f) dissolving the novolak resin copolymer precipitate from e) in a photoresist solvent, then removing any remaining deionized water and water soluble organic polar solvent, such as by distilling under vacuum and low temperature, and thereby producing a solution of film forming, fractionated novolak resin copolymer in said photoresist solvent.

The present invention further provides a process for producing a positive working photoresist composition having superior lithographic performance. The subject process comprises:

a) condensing formaldehyde with one or more phenolic compounds, in the presence of an acid catalyst, then incorporating a presynthesized polymer of a multi-hydroxy benzene/ketone or aldehyde and thereby producing a novolak resin copolymer with the multi-hydroxybenzene/ketone or aldehyde moiety incorporated as part of a block copolymer;

b) isolating the novolak resin copolymer from a) by removing the unreacted formaldehyde and/or phenolic compound monomers, such as by distilling off the unreacted monomers;

c) adding to the novolak resin copolymer from b) a water soluble organic polar solvent to provide a solution of from about 15 to about 40 weight percent copolymer, preferably from about 20 to about 30 weight percent; then adding deionized (DI) water, at a ratio of water soluble organic polar solvent, deionized water of 1:10 to 10:1, preferably 2:8 to 8:2, more preferably 3:7 to 7:3 and most preferably 4:6 to 6:4, and thereby precipitating the novolak resin copolymer and providing a solution of the remaining phenolic compounds, low molecular weight novolak resin, and useless monomers and oligomers;

d) removing, such as by decanting or by suction, the remaining solution from c);

e) adding a water soluble organic polar solvent to the precipitated novolak resin copolymer from c), and thereby providing a solution of from about 15 to about 40 weight percent copolymer, preferably from about 20 to about 30 weight percent; then adding deionized water, at a ratio of water soluble organic polar solvent-:deionized water of from about 1:10 to about 10:1, preferably from about 2:8 to about 8:2, more preferably from about 3:7 to about 7:3, and most preferably from about 4:6 to about 6:4, thereby again precipitating the novolak resin copolymer, and then removing, such as by decanting or by suction, the remaining solution;

f) dissolving the novolak resin copolymer precipitate from e) in a photoresist solvent, then removing any remaining deionized water and water soluble organic polar solvent, such as by distilling under vacuum and low temperature, and thereby producing a solution film forming, fractionated novolak resin copolymer in said photoresist solvent;

g) providing an admixture of: 1) a photosensitive component in an amount sufficient to photosensitive a photoresist composition; 2) the film forming fractionated novolak resin copolymer solution from f); and 3) additional photoresist solvent, and thereby forming a photoresist composition.

The invention further provides a method for producing a semiconductor device by producing a photo-image on a substrate by coating a suitable substrate with a positive working photoresist composition. The subject process comprises:

a) condensing formaldehyde with one or more phenolic compounds, in the presence of an acid catalyst, then incorporating a presynthesized polymer of a multi-hydroxy benzene/ketone or aldehyde condensate, and thereby producing a novolak resin copolymer with the multi-hydroxybenzene/ketone or aldehyde moiety incorporated as part of a block copolymer;

b) isolating the novolak resin copolymer from a) by removing the unreacted formaldehyde and/or phenolic compound monomers, such as by distillation;

c) adding to the novolak resin copolymer from b) a water soluble organic polar solvent and thereby providing a solution of from about 15 to about 40 weight percent copolymer, preferably from about 20 to about 30 weight percent; then adding deionized (DI) water, to the novolak resin copolymer solution, at a ratio of water soluble organic polar solvent, deionized water of from about 1:10 to about 10:1, preferably from about 2:8 to about 8:2, more preferably from about 3:7 to about 7:3 and most preferably from about 4:6 to about 6:4, thereby precipitating the novolak resin copolymer and providing a solution of the remaining unreacted phenolic compounds, low molecular weight novolak resin, and useless monomers and oligomers;

d) removing, such as by decanting or by suction, the remaining solution from c);

e) adding a water soluble organic polar solvent to the precipitated novolak resin copolymer from c) and thereby providing a solution of from about 15 to about 40 weight percent copolymer, preferably from about 20 to about 30 weight percent; then adding deionized water, at a ratio of water soluble organic polar solvent-:deionized water of from about 1:10 to about 10:1, preferably from about 2:8 to about 8:2, more preferably from about 3:7 to about 7:3, and most preferably from about 4:6 to about 6:4, thereby again precipitating the novolak resin polymeric condensation product, and then removing, such as by decanting or by suction, the remaining solution;

f) dissolving the novolak resin copolymer precipitate from e) in a photoresist solvent, then removing any remaining water and water soluble organic polar solvent, such as by distilling under vacuum and low temperature, and thereby producing a film forming, fractionated novolak resin copolymer solution in said photoresist solvent;

e) providing an admixture of: 1) a photosensitive component in an amount sufficient to photosensitive a photoresist composition; 2) the film forming novolak resin solution from e); and 3) additional photoresist solvent, and thereby forming a photoresist composition;

f) coating a suitable substrate with the photoresist composition from e);

g) heat treating the coated substrate from f) until substantially all of the photoresist solvent is removed; image-wise exposing the photosensitive composition and removing the image-wise exposed areas of such composition with a suitable developer, such as an aqueous alkaline developer. Optionally one may also perform a baking of the substrate either immediately before or after the removing step.

DESCRIPTION OF THE PREFERRED EMBODIMENTS

Novolak resins have been commonly used in the art of photoresist manufacture as exemplified by "Chemistry and Application of Phenolic Resins", Knop A. And Scheib, W.; Springer Verlag, New York, 1979 in Chapter 4. Similarly, o-quinone diazides are well known to the skilled artisan as demonstrated by "Light Sensitive Systems", Kosar, J.; John Wiley & Sons, New York, 1965 Chapter 7.4. It is known to the art that the characteristics of photoresist can be improved by controlling the molecular weight distribution, in other words polydispersity. Low polydispersity will give better results, and this can be achieved by removing low molecular weight fraction from the novolak resin (disclosed in JP-A-60-97347, JP-A-60-189739, and JP-A-60-45238). U.S. Pat. No. 5,340,686 described of using 2 to 30% by weight of novolak resin, of low molecular weight compound having a total of 12 to 50 carbon atoms and 2 to 8 phenolic hydroxyl groups per molecule to achieve better resolution and development latitude. The low molecular weight hydroxy compounds are used to accelerate the dissolution rate. However, it was observed that addition of such a low molecular weight hydroxy compounds increases the film loss of unexposed area, also deteriorates the thermal characteristics of the photoresist, yield scum and lower the depth of focus. Without these low molecular weight compounds the photospeed is very high which make the photoresist is useless.

The instant invention has found that the use of particular low molecular weight resins such as an acetone/pyrogallol copolymer or acetone/2-methyl resorcinol copolymer as an ingredient along with cresols to make a novolak resin block copolymer (as shown below), as opposed to those taught in the prior art, produces a photoresist having a superior resolution and depth of focus and faster photospeed with higher thermal characteristics. Such copolymers have the following structure:

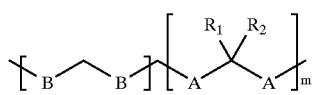

where:
A=pyrogallol, resorcinol, 2-methylresorcinol, 5-methylresorcinol 2,5-dimethyl resorcinol
$R_1$=H
$R_2$=H $C_1$–$C_3$ alkyl
B=novolak resin, made by condensation of formaldehyde and cresols such as m-cresol, p-cresol, o-cresol, 2,4-, 2,5-, 2,3-, 2,6-3,5-, or 3,4-dimethylphenol, 2,3,5-, or 3,4,5-trimethylphenol, with one or more multi-hydroxy benzen such as resorcinol, 2-methylresorcinol, 5-methylresorcinol, 2,5-dimethylresorcinol or pyrogallol.

Moiety "m", which is the multi-hydroxy benzene/ketone or aldehyde condensate, comprises from about 1 to about 50 weight percent of the novolak resin block copolymer, preferably from about 2 to about 30 percent, more preferably from about 2 to about 20 percent, and most preferably from about 2 to about 10 percent.

Optional ingredients for the photoresist compositions of the present invention include colorants, dyes, anti-striation agents, leveling agents, plasticizers, adhesion promoters, speed enhancers, solvents and such surfactants as non-ionic surfactants, which may be added to the solution of novolak resin, sensitizer and solvent before the photoresist composition is coated onto a substrate. Examples of dye additives that may be used together with the photoresist compositions of the present invention include Methyl Violet 2B (C.l. No. 42535), Crystal Violet (C.l. 42555), Malachite Green (C.l. No. 42000), Victoria Blue B (C.l. No. 44045) and Neutral Red (C.l. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of novolak and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyl trichlorosilane; and gamma-amino-propyl triethoxysilane, up to about a 4 percent weight level, based on the combined weight of novolak and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and subsequent drying. Non-ionic surfactants that may be used include, for example, nonylphenoxy poly(ethyleneoxy) ethanol; octylphenoxy ethanol at up to about 10% weight levels, based on the combined weight of novolak and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/ aluminum oxide wafer can also be used. The substrate may also comprise various polymeric resins, especially transparent polymers such as polyesters. The substrate may have an adhesion promoted layer of a suitable composition, such as one containing hexa-alkyl disilazane, preferably hexamethyl disilazane (HMDS).

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment, either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by a spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

In a 1 liter round bottom flask fitted with stirrer and a thermometer with a constant temperature thermowatch unit, 183.3 grams of electronic grade acetone was mixed with 200 grams of pyrogallol (1,2,3-trihydroxybenzene). The mixture was stirred for 15 minutes at room temperature to dissolve the solid pyrogallol. To this solution 4.4 grams of concentrated hydrochloric acid was added and the solution was gently heated to about 50° C., at which point a mild exotherm took the temperature up to about 77° C. Once the temperature leveled off, the thermowatch was set for a cut-off temperature of 90° C. and heating was continued at reflux for 3 hours. The temperature ranged from 77° C. to about 88° C. during the course of the reaction. The reaction mixture became quite viscous with some large insolubles evident. 400 grams of additional acetone was added to completely dissolve the resin and make the solution less viscous. The solution was cooled to below 30° C. and the resin was precipitated by drowning the acetone solution in 4000 ml. of deionized water over a 2 hour period at 10° C. The precipitate was filtered and washed with DI water and the wet cake was dried in a vacuum drier.

The weight average molecular weight ($MW_w$) of the precipitate as determined by gel permeation chromatography (GPC) was 1442 and dissolution rate was 857.6 Å/sec.

EXAMPLE 2

A mixture of phenolic compounds consisting of 217.04 grams of m-cresol, 173.6 grams of p-cresol, 109.3 grams of 2,3,5-trimethyl phenol, and 5.06 grams of the acetone/pyrogallol copolymer from example 1 were transferred to a four necked flask equipped with a condenser, a thermometer, and a dropping funnel. 1.5 grams of oxalic acid was added and the flask was heated to 95° C. 245.7 grams of formaldehyde (molar ratio of phenolic compounds/formaldehyde: 1/0.685) was added dropwise over one hour. The reaction was allowed to continue for 6 hours at 95° C. The reaction mixture was then distilled, initially at atmospheric pressure, and then a vacuum was applied to reach a final temperature of 200° C. and a pressure of 30 mm Hg. The molten novolak resin was collected in a tray, and yielded 395.9 grams of solid novolak resin, GPC-$MW_w$ was 2193.

150 grams of the solid novolak resin was dissolved in 475 grams of methanol to provide a 24% (by weight) solution. 173.75 grams of DI water (27.8%, by weight, of the batch) was added with stirring over a period of ten minutes. Stirring was stopped and a white precipitate settled to the bottom of the flask. The liquid layer on top was sucked out and discarded. The white precipitate was redissolved in 237.5 grams of methanol, and 86.88 grams of DI water was then added with stirring. Stirring was stopped and a white precipitate settled to the bottom of the flask. The liquid layer on top was removed and discarded, and the white precipitate was dissolved in ethyl lactate. The residual methanol and water were removed by vacuum distillation at 75° C. and 20 mm Hg pressure. GPC-$MW_w$ and PD (polydispersity) were measured and the results are shown in Table 1 below.

EXAMPLE 3

A mixture of phenolic compounds consisting of 217.00 grams of m-cresol, 174.00 grams of p-cresol, 109.00 grams of 2,3,5-trimethyl phenol, and 25.00 grams of the acetone pyrogallol copolymer from example 1 were transferred to a four necked flask equipped with a condenser, a thermometer, and a dropping funnel. 1.6 grams of oxalic acid was added and the flask was heated to 95° C. 255.7 grams of formaldehyde (molar ratio of phenols/formaldehyde 1/0.69) was added dropwise over one hour. The reaction was allowed to continue for 3 hours at 95° C. The reaction mixture was then distilled, initially at atmospheric pressure and then a vacuum was applied to reach a final temperature of 200° C. and a pressure of 30 mm Hg. The molten novolak resin was collected in a tray, and the GPC-MW$_w$ was found to be 2769.

150 grams of the solid novolak resin was dissolved in 475 grams of methanol to provide a 24% (by weight) solution. 173.75 grams of DI water (27.8%, by weight, of the batch) was added with stirring over a period of ten minutes. Stirring was stopped and a white precipitate settled to the bottom of the flask. The liquid layer on top was sucked out and discarded. The white precipitate was redissolved in 237.5 grams of methanol, and 86.88 grams of DI water was then added with stirring. Stirring was stopped and a white precipitate settled to the bottom of the flask. The liquid layer on top was removed and discarded, and the white precipitate was dissolved in ethyl lactate. The residual methanol and water were removed by vacuum distillation at 75° C. and 20 mm Hg pressure. GPC-MW$_w$ and PD (polydispersity) were measured and the results are shown in Table 1 below:

EXAMPLE 4

A mixture of phenolic compounds consisting of 217.00 grams of m-cresol, 174.00 grams of p-cresol, 109.00 grams of 2,3,5-trimethyl phenol, and 12.45 grams of the acetone/pyrogallol copolymer from example 1 were transferred to a four necked flask equipped with a condenser, a thermometer, and a dropping funnel. 1.6 grams of oxalic acid was added and the flask was heated to 95° C. 255.7 grams of formaldehyde (molar ratio of phenolic compounds/formaldehyde: 1/0.69) was added dropwise over one hour. The reaction was allowed to continue for 3 hours at 95° C. The reaction mixture was then distilled, initially at atmospheric pressure and then vacuum was applied to reach a final temperature 200° C. and a pressure of 30 mm Hg. The molten novolak resin was collected in a tray.

150 grams of the solid novolak resin was dissolved in 475 grams of methanol to provide a 24% (by weight) solution. 173.75 grams of DI water (27.8%, by weight, of the batch) was added with stirring over a period of ten minutes. Stirring was stopped and a white precipitate settled to the bottom of the flask. The liquid layer on top was sucked out and discarded. The white precipitate was redissolved in 237.5 grams of methanol, and 86.88 grams of DI water was added with stirring. Stirring was stopped and a white precipitate settled to the bottom of the flask. The liquid layer on top was removed and discarded, and the white precipitate was dissolved in ethyl lactate. The residual methanol and water were removed by vacuum distillation at 75° C. and 20 mm Hg pressure. GPC-MW$_w$ and PD (polydispersity) were measured and the results are shown in Table 1 below.

EXAMPLE 5

Example 4 was repeated and the resin obtained were analyzed for molecular weight. The results are shown in Table 1 below.

EXAMPLE 6

A mixture of phenolic compounds consisting of 217.00 grams of m-cresol, 174.00 grams of p-cresol, 109.00 grams of 2,3,5-trimethyl phenol, and 25.00 grams of the acetone/pyrogallol copolymer from example 1 were transferred to a four necked flask equipped with a condenser, a thermometer, and a dropping funnel. 1.6 grams of oxalic acid was added and the flask was heated to 95° C. 240.9 grams of formaldehyde (molar ratio of phenols/formaldehyde 1/0.65) was added dropwise over one hour. The reaction was allowed to continue for 3 hours at 95° C. The reaction mixture was then distilled, initially at atmospheric pressure and then vacuum was applied to reach a final temperature 200° C. and a pressure of 30 mm Hg. The molten novolak resin was collected in a tray.

150 grams of the solid novolak resin was dissolved in 475 grams of methanol to provide a 24% (by weight) solution. 173.75 grams of DI water (27.8%, by weight, of the batch) was added with stirring over a period of ten minutes. Stirring was stopped and a white precipitate settled to the bottom of the flask. The liquid layer on top was sucked out and discarded. The white precipitate was redissolved in 237.5 grams of methanol, and 86.88 grams of DI water was then added with stirring. Stirring was stopped and a white precipitate settled to the bottom of the flask. The liquid layer on top was removed and discarded, and the white precipitate was dissolved in ethyl lactate. The residual methanol and water were removed by vacuum distillation at 75° C. and 20 mm Hg pressure. GPC-MW$_w$ and PD (polydispersity) were measured and the results are shown in Table 1 below.

EXAMPLE 7

A mixture of phenolic compounds consisting of 217.00 grams of m-cresol, 174.00 grams of p-cresol, 109.00 grams of 2,3,5-trimethyl phenol, and 12.45 grams of the acetone/pyrogallol copolymer from example 1 were transferred to a four necked flask equipped with a condenser, a thermometer, and a dropping funnel. 1.6 grams of oxalic acid was added and the flask was heated to 95° C. 261.2 grams of formaldehyde (molar ratio of phenols/formaldehyde 1/0.705) was added dropwise over one hour. The reaction was allowed to continue for 3 hours at 95° C. The reaction mixture was then distilled, initially at atmospheric pressure and then vacuum was applied to reach a final temperature 200° C. and a pressure of 30 mm Hg. The molten novolak resin was collected in a tray.

250 grams of the solid novolak resin was dissolved in 825 grams of methanol to provide a 24% (by weight) solution. 296 grams of DI water (27.8%, by weight, of the batch) was added with stirring over a period of ten minutes. Stirring was stopped and a white precipitate settled to the bottom of the flask. The liquid layer on top was sucked out and discarded. The white precipitate was redissolved in 410 grams of methanol, and 148 grams of DI water was then added with stirring. Stirring was stopped and a white precipitate settled to the bottom of the flask. The liquid layer on top was removed and discarded, and the white precipitate was dissolved in ethyl lactate. The residual methanol and wter were removed by vacuum distillation at 75° C. and 20 mm Hg pressure. GPC-MW$_w$ and PD (polydispersity) were measured and the results are shown in Table 1 below.

TABLE 1

| Example # | Resins | GPC MW | PD | Dissolution Rate |
|---|---|---|---|---|
| 2 | Parent Resin | 2193 | 2.2 | |
| 2 | Fractionated Resin | 3331 | 1.9 | 110 |

TABLE 1-continued

| Example # | Resins | GPC MW | PD | Dissolution Rate |
|---|---|---|---|---|
| 3 | Parent Resin | 2769 | 2.9 | |
| 3 | Fractionated Resin | 4154 | 2.2 | 67.0 |
| 4 | Parent Resin | 3366 | 2.1 | |
| 4 | Fractionated Resin | 5401 | 2.1 | 126.0 |
| 5 | Parent Resin | 2516 | 3.6 | |
| 5 | Fractionated Resin | 3979 | 1.8 | 132.6 |
| 6 | Parent Resin | 2016 | 2.0 | |
| 6 | Fractionated Resin | 3150 | 2.4 | 174.0 |
| 7 | Parent Resin | 2918 | 2.4 | |
| 7 | Fractionated Resin | 4590 | 1.9 | 71.8 |

EXAMPLE 8

A 100 gram photoresist test sample was prepared according to the following formulation:

| | |
|---|---|
| NK-280 (a proprietary 2,1,5-diazonaphthoquinone sulfonyl chloride based sensitizer from Nippon Zeon Co.) | 4.04 gm |
| NK-240 (a proprietary 2,1,4-diazonaphthoquinone sulfonyl chloride based sensitizer from Nippon Zeon Co.) | 1.68 gm |
| Novolak Resin fraction from example 2 (29.6% in Ethyl Lactate) | 40.56 gm |
| B126X-SA (a proprietary speed enhancer from Nippon Zeon Co.) | 2.46 gm |
| KP-341 a striation free surfactant from Shinetsue Chem. Co. (2% in Ethyl Lactate) | 0.6 gm |
| Ethyl Lactate | 38.96 gm |
| n-Butyl Acetate | 11.70 gm |

The photoresist resist sample was coated on a hexamethylene disilazine (HMDS) primed silicon wafer to a 0.974 μm film thickness, and a soft bake at 90° C. for 90 seconds on an SVG® 8100 I-line hot plate was used. The exposure matrix was printed on the coated wafer using a 0.54 NA NIKON® i-line stepper and a NIKON® resolution reticle. The exposed wafer was baked after exposure at 110° C. for 70 seconds on an in-line hot plate. The wafer was then developed using AZ® 300 MIF TMAH (2.38%) developer. The developed wafers were examined using a HITACHI® S-400 SEM. A nominal dose to print (DTP) was measured at the best focus, the dose required to precisely replicate a given feature. Resolution and depth of focus (DOF) were measured and are shown in Table 2 below.

EXAMPLE 9

A 100 gram photoresist test sample was prepared according to the following formulation:

| | |
|---|---|
| NK-280 (a proprietary 2,1,5-diazonaphthoquinone sulfonyl chloride based sensitizer from Nippon Zeon Co.) | 4.04 gms |
| NK-240 (a proprietary 2,1,4-diazonaphthoquinone sulfonyl chloride based sensitizer from Nippon Zeon Co.). | 1.68 gms |
| Novolak Resin fraction from example 3 (as 30.3% solid in EL) | 46.69 gms |
| B126X-SA (a proprietary speed enhancer from Nippon Zeon Co.) | 2.46 gms |
| KP-341 a striation free surfactant from Shinetsue Chem. Co. (2% in Ethyl Lactate) | 0.40 gm |
| Ethyl Lactate | 33.10 gm |
| n-Butyl Acetate | 11.70 gm |

The photoresist resist sample was coated on an HMDS primed silicon wafer to a 0.974 μm film thickness, and a soft bake at 90° C. for 90 seconds on an SVG® 8100 I-line hot plate was used. The exposure matrix was printed on the coated wafers using a 0.54 NA NIKON® i-line stepper and a NIKON® resolution reticle. The exposed wafers were post exposure baked at 110° C. for 70 seconds on a in line hot plate. The wafers were then developed using AZ® 300 MIF TMAH (2.38%) developer. The developed wafers were examined using a HITACHI® S-400 SEM. A nominal dose to print (DTP) was measured at the best focus, the dose required to precisely replicate a given feature. Resolution and depth of focus (DOF) were measured and are shown in Table 2 below.

EXAMPLE 10

A 100 gram photoresist test sample was prepared according to the following formulation:

| | |
|---|---|
| NK-280 (a proprietary 2,1,5-diazonaphthoquinone sulfonyl chloride based sensitizer from Nippon Zeon Co.) | 4.04 gms |
| NK-240 (a proprietary 2,1,4-diazonaphthoquinone sulfonyl chloride based sensitizer from Nippon Zeon Co.) | 1.68 gms |
| Novolak Resin fraction from example 4 (as 30.3% solid in EL) | 45.69 gms |
| B126X-SA (a proprietary speed enhancer from Nippon Zeon Co.) | 2.46 gms |
| KP-341, a striation free surfactant from Shinetsue Chem. Co. (2% in Ethyl Lactate) | 0.60 gm |
| Ethyl Lactate | 33.84 gm |
| n-Butyl Acetate | 11.70 gm |

The photoresist resist sample was coated on an HMDS primed silicon wafer to a 0.974 μm film thickness, and a soft bake at 90° C. for 90 seconds on an SVG® 8100 I-line hot plate was used. The exposure matrix was printed on the coated wafers using a 0.54 NA NIKON® i-line stepper and a NIKON® resolution reticle. The exposed wafers were post exposure baked at 110° C. for 70 seconds on a in line hot plate. The wafers were then developed using AZ® 300 MIF TMAH (2.38%) developer. The developed wafers were examined using a HITACHI® S400 SEM. A nominal dose to print (DTP) was measured at the best focus, the dose required to precisely replicate a given feature. Resolution and depth of focus (DOF) were measured and are shown in Table 2 below.

EXAMPLE 11

A 100 gram photoresist test sample was prepared according to the following formulation:

| | |
|---|---|
| NK-280 (a proprietary 2,1,5-diazonaphthoquinone sulfonyl chloride based sensitizer from Nippon Zeon Co.) | 4.04 gm |
| NK-240 (a proprietary 2,1,4-diazonaphthoquinone sulfonyl chloride based sensitizer from Nippon Zeon Co.) | 1.68 gm |
| Novolak Resin fraction from example 5 (as 30.3% solid in EL) | 46.69 gm |
| B126X-SA (a proprietary speed enhancer from Nippon Zeon Co.) | 2.46 gm |
| KP-3411, a striation free surfactant from Shinetsue Chem. Co. (2% in Ethyl Lactate) | 0.60 gm |
| Ethyl Lactate | 33.84 gm |
| n-Butyl Acetate | 11.70 gm |

The photoresist resist sample was coated on an HMDS primed silicon wafer to a 0.974 μm film thickness, and a soft bake at 90° C. for 90 seconds on an SVG® 8100 I-line hot plate was used. The exposure matrix was printed on the coated wafer using a 0.54 NA NIKON® i-line stepper and a NIKON® resolution reticle. The exposed wafer was post exposure baked at 110° C. for 70 seconds on a in line hot plate. The wafer was then developed using AZ® 300 MIF TMAH (2.38%) developer. The developed wafer was examined using a HITACHI® S0400 SEM. A nominal dose (DTP) was measured at the best focus, the dose required to precisely replicate a given feature. Resolution and depth of focus (DOF) were measured and are shown in Table 2 below.

EXAMPLE 12

A 100 gram photoresist test sample was prepared according to the following formulation:

| | |
|---|---|
| NK-280 (a proprietary 2,1,5-diazonaphthoquinone sulfonyl chloride based sensitizer from Nippon Zeon Co.) | 4.04 gm |
| NK-240 (a proprietary 2,1,4-diazonaphthoquinone sulfonyl chloride based sensitizer from Nippon Zeon Co.) | 1.68 gm |
| Novolak Resin fraction from example 6 (as 29.7% solid in EL) | 46.56 gm |
| B126X-SA (a proprietay speed enhancer from Nippon Zeon Co.) | 2.46 gm |
| KP-341, a striation free surfactant from Shinetsue Chem. Co. (2% in Ethyl Lactate) | 0.40 gm |
| Ethyl Lactate | 33.16 gm |
| n-Butyl Acetate | 11.70 gm |

The photoresist resist sample was coated on an HMDS primed silicon wafer to a 0.974 μm film thickness, and a soft bake at 90° C. for 90 seconds on an SVG® 8100 I-line hot plate was used. The exposure matrix was printed on the coated wafer using a 0.54 NA NIKON® i-line stepper and a NIKON® resolution reticle. The exposed wafer was post exposure baked at 110° C. for 70 seconds on a in line hot plate. The wafer was then developed using AZ® 300 MIF TMAH (2.38%) developer. The developed wafer was examined using a HITACHI® S0400 SEM. A nominal dose (DTP) was measured at the best focus, the dose required to precisely replicate a given feature. Resolution and depth of focus (DOF) were measured and are shown in Table 2 below.

EXAMPLE 13

A 100 gram photoresist test sample was prepared according to the following formulation:

| | |
|---|---|
| NK-280 (a proprietary 2,1,5-diazonaphthoquinone sulfonyl chloride based sensitizer from Nippon Zeon Co.) | 4.04 gm |
| NK-240 (a proprietary 2,1,4-diazonaphthoquinone sulfonyl chloride based sensitizer from Nippon Zeon Co.) | 1.68 gm |
| Novolak Resin fraction from example 7 (as 29.7% solid in EL) | 50.45 gm |
| B126X-SA (a proprietary speed enhancer from Nippon Zeon Co.) | 2.46 gm |
| KP-341, a striation free surfactant from Shinetsue Chem. Co. (2% in Ethyl Lactate) | 0.60 gm |
| Ethyl Lactate | 29.07 gm |
| n-Butyl Acetate | 11.70 gm |

The photoresist resist sample was coated on an HMDS primed silicon wafer to a 0.974 μm film thickness, and a soft bake at 90° C. for 90 seconds on an SVG® 8100 I-line hot plate was used. The exposure matrix was printed on the coated wafer using a 0.54 NA NIKON® i-line stepper and a NIKON® resolution reticle. The exposed wafer was post exposure baked at 110° C. for 70 seconds on a in line hot plate. The wafer was then developed using AZ® 300 MIF TMAH (2.38%) developer. The developed wafer was examined using a HITACHI® S-400 SEM. A nominal dose (DTP) was measured at the best focus, the dose required to precisely replicate a given feature. Resolution and depth of focus (DOF) were measured and are shown in Table 2 below.

Unless otherwise stated all parts and percent are by weight, all molecular weights are weight average molecular weight, all parts and percent are by weight and all temperatures are ° C.

Comparative Example 300 grams of phenolic compounds consisting of a cresol ratio 5/4/2, using 130.26 grams of m-cresol, 104.9 grams of p-cresol, 6509 grams of 2,3,5-trimethyl phenol, and 54.46 grams of paraformaldehyde (molar ratio of phenolic compounds/paraformaldehyde 1/0.70) were transferred to a four necked flask equipped with a condenser, a thermometer, and a dropping funnel containing 100 grams DI water. 0.9 grams of oxalic acid were added and the flask was heated to 95° C. There was an exotherm to 120° C. and 40 grams of DI water were added to combat the exotherm. The reaction ran at condensation for 2 hours. The reaction mixture was then distilled, initially under atmospheric pressure to 175° C., then vacuum was applied and the reaction was distilled for 15 minutes at 200° C. and 10 mm Hg. After vacuum distillation, the molten resin was poured into a pan, about 250 g solid novolak resin was obtained having a GPC $MW_w$ of 2733.

200 grams of this novolak resin was dissolved in 634.6 grams of methanol to provide a 24% solids solution. To this resin solution, 27.8% (w/w) DI water (232 g) was added under stirring to form a taffy like precipitate. After allowing the precipitate to settle, the top liquid layer was siphoned off (834 g/78.3% of the total). One half (317.3 g) the original amount of methanol was added to redissolve the precipitate. Then one half (116 g) the original amount of water was added under stirring to reprecipitate the resin. After allowing the precipitate to settle, the top liquid layer was siphoned off (458 g/68.9% of the total). Ethyl lactate was added to the resin to dissolve it and the final solution was vacuum distilled at 75° C. and 25 mm Hg to remove residual water, methanol, and to achieve a 30% solids solution, of a resin having a GPC $MW_w$ of 4934 and a dissolution rate of 22.1 Å/sec. The resin was formulated as in example 8. The lithography results are shown in table 2 below, for comparison.

TABLE 2

| Example # | Resin From | DTP | Resolution (μm) | DOF (μm) |
|---|---|---|---|---|
| 8 | Example 2 | 150 | 0.34 | −0.6/0.8 |
| 9 | Example 3 | 180 | 0.32 | −0.8/0.2 |
| 10 | Example 4 | 125 | 0.36 | −0.8/0.2 |
| 11 | Example 5 | 115 | 0.34 | −0.8/0.2 |
| 12 | Example 6 | 110 | 0.34 | −0.8/0.2 |
| 13 | Example 7 | 165 | 0.34 | −0.6/0.4 |
| Comparative | Comparative | 275 | 0.32 | −0.6/0.4 |

We claim:

1. A method for producing a film forming novolak resin which comprises:
   a) condensing formaldehyde with one or more phenolic compounds, in the presence of an acid catalyst, then incorporating a presynthesized polymer of a multi-hydroxy benzene with a ketone or aldehyde, and thereby producing a novolak resin block copolymer with the multi-hydroxybenzene/ketone or aldehyde moiety incorporated as part of a block copolymer;
   b) isolating the novolak resin block copolymer from a) by removing the unreacted formaldehyde or phenolic compound monomers;
   c) adding to the novolak resin block copolymer from b) a water soluble organic polar solvent to provide a solution of from about 15 to about 40 weight percent copolymer, then adding deionized water, at a ratio of water soluble organic polar solvent:deionized water of from about 1:10 to about 10:1, and thereby precipitating the novolak resin block copolymer and providing a solution of the remaining unreacted phenolic compounds, low molecular weight novolak resin, and useless monomers and oligomers;

d) removing the remaining solution from c);

e) adding a water soluble organic polar solvent to the precipitated novolak resin block copolymer from c) and thereby providing a solution of from about 15 to about 40 weight percent novolak resin block copolymer, then adding deionized water, at a ratio of water soluble organic polar solvent:deionized water of from about 1:10 to about 10:1, thereby again precipitating the novolak resin block copolymer, and then removing the remaining solution;

f) dissolving the novolak resin block copolymer precipitate from e) in a photoresist solvent, then removing any remaining deionized water and water soluble organic polar solvent, such as by distilling under vacuum and low temperature, and thereby producing a solution of film forming, fractionated novolak resin block copolymer in said photoresist solvent.

2. The method of claim 1, wherein in step a) said multi-hydroxy benzene is resorcinol, 2-methylresorcinol, 5-methylresorcinol, 2,5-dimethylresorcinol or pyrogallol.

3. The method of claim 1, wherein in step a) said one or more phenolic compounds is in one or more of m-cresol, p-cresol, O-cresol, 2,4-dimethylphenol, 2,5-dimethylphenol, 2,3-dimethylphenol, 2,6-dimethylphenol, 3,5-dimethylphenol, 3,4-dimethylphenol, 2,3,5-trimethylphenol or 3,4,5-trimethylphenol.

4. The method of claim 1, wherein the novolak resin block copolymer produced from step a) has the following structure:

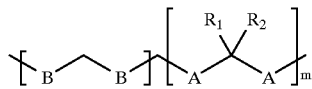

where:

A=pyrogallol, resorcinol, 2-methylresorcinol, 5-methylresorcinol, 2,5-dimethyl resorcinol $R_1$=H $R_2$=H, $C_1$–$C_3$ alkyl B=novolak resin, made by condensation of formaldehyde and one or more cresols, selected from m-cresol, p-cresol, o-cresol, 2,4-, 2,5-, 2,3- or 2,6-3,5-, 3,4-dimethylphenol, 2,3,5-, 3,4,5-trimethylphenol, with one or more multi-hydroxy benzen such as resorcinol, 2-methylresorcinol, 5-methylresorcinol, 2,5-dimethylresorcinol or pyrogallol and m is from 1 to 50 weight percent of the novolak resin block copolymer.

5. The method of claim 1, wherein the amount of multi-hydroxy benzene/ketone or aldehyde is 1 to 50% of the novolak resin block copolymer.

6. A method for producing a positive photoresist composition having superior lithographic performance comprising:

a) condensing formaldehyde with one or more phenolic compounds, in the presence of an acid catalyst, then incorporating a presynthesized polymer of a multi-hydroxy benzene/ketone or aldehyde and thereby producing a novolak resin block copolymer with the multi-hydroybenzene/ketone or aldehyde moiety incorporated as part of a block copolymer;

b) isolating the novolak resin block copolymer from a) by removing the unreacted formaldehyde and/or phenolic compound monomers;

c) adding to the novolak resin block copolymer from b) a water soluble organic polar solvent to provide a solution of from about 15 to about 40 weight percent copolymer, then adding deionized (DI) water, at a ratio of water soluble organic polar solvent:deionized water of 1:10 to 10:1, and thereby precipitating the novolak resin block copolymer and providing a solution of the remaining phenolic compounds, low molecular weight novolak resin, and useless monomers and oligomers;

d) removing the remaining solution from c);

e) adding a water soluble organic polar solvent to the precipitated novolak resin block copolymer from c), and thereby providing a solution of from about 15 to about 40 weight percent novolak resin block copolymer, then adding deionized water, at a ratio of water soluble organic polar solvent:deionized water of from about 1:10 to about 10:1, thereby again precipitating the novolak resin block copolymer, and then removing the remaining solution;

f) dissolving the novolak resin block copolymer precipitate from e) in a photoresist solvent, then removing any remaining deionized water and water soluble organic polar solvent, such as by distilling under vacuum and low temperature, and thereby producing a solution film forming, fractionated novolak resin block copolymer in said photoresist solvent;

g) providing an admixture of: 1) a photosensitive component in an amount sufficient to photosensitize a photoresist composition; 2) the film forming fractionated novolak resin block copolymer solution from f); and 3) additional photoresist solvent, and thereby forming a photoresist composition.

7. The method of claim 6, wherein in step a) said multi-hydroxy benzene is resorcinol, 2-methylresorcinol, 5-methylresorcinol, 2,5-dimethylresorcinol or pyrogallol.

8. The method of claim 6, wherein in step a) said one or more phenolic compounds is one or more of m-cresol, p-cresol, O-cresol, 2,4-dimethylphenol, 2,5-dimethylphenol, 2,3-dimethylphenol, 2,6-dimethylphenol, 3,5-dimethylphenol, 3,4-dimethylphenol, 2,3,5-trimethylphenol or 3,4,5-trimethylphenol.

9. The method of claim 6, wherein the novolak resin block copolymer produced from step a) has the following structure:

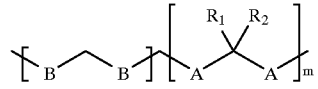

where:

A=pyrogallol, resorcinol, 2-methylresorcinol, 5-methylresorcinol, 2,5-dimethyl resorcinol $R_1$=H $R_2$=H, $C_1$–$C_3$ alkyl B=novolak resin, made by condensation of formaldehyde and one or more cresols, selected from m-cresol, p-cresol, o-cresol, 2,4-, 2,5-, 2,3- or 2,6-3,5-, 3,4-dimethylphenol, 2,3,5-, 3,4,5-trimethylphenol, with one or more multi-hydroxy benzen such as resorcinol, 2-methylresorcinol, 5-methylresorcinol, 2,5-dimethylresorcinol or pyrogallol and m is from 1 to 50 weight percent of the novolak resin block copolymer.

10. The method of claim 6, wherein the amount of multihydroxy benzene/ketone or aldehyde is 1 to 50% of the novolak resin block copolymer.

11. A method for producing a semiconductor device by producing a photo-image on a substrate by coating a suitable substrate with a positive working photoresist composition comprising:
   a) condensing formaldehyde with one or more phenolic compounds, in the presence of an acid catalyst, then incorporating a presynthesized polymer of a multi-hydroxy benzene/ketone or aldehyde condensate, and thereby producing a novolak resin block copolymer with the multi-hydroxybenzene/ketone or aldehyde moiety incorporated as part of a block copolymer;
   b) isolating the novolak resin block copolymer from a) by removing the unreacted formaldehyde and/or phenolic compound monomers;
   c) adding to the novolak resin block copolymer from b) a water soluble organic polar solvent and thereby providing a solution of from about 15 to about 40 weight percent copolymer, then adding deionized (DI) water, to the novolak resin block copolymer solution, at a ratio of water soluble organic polar solvent:deionized water of from about 1:10 to about 10:1, and thereby precipitating the novolak resin block copolymer and providing a solution of the remaining unreacted phenolic compounds, low molecular weight novolak resin, and useless monomers and oligomers;
   d) removing the remaining solution from c);
   e) adding a water soluble organic polar solvent to the precipitated novolak resin block copolymer from c) and thereby providing a solution of from about 15 to about 40 weight percent novolak resin block copolymer, then adding deionized water, at a ratio of water soluble organic polar solvent:deionized water of from about 1:10 to about 10:1, thereby again precipitating the novolak resin polymeric condensation product, and then removing, such as by decanting or by suction, the remaining solution;
   f) dissolving the novolak resin block copolymer precipitate from e) in a photoresist solvent, then removing any remaining water and water soluble organic polar solvent, such as by distilling under vacuum and low temperature, and thereby producing a film forming, fractionated novolak resin block copolymer solution in said photoresist solvent:
   g) providing an admixture of: 1) a photosensitive component in an amount sufficient to photosensitize a photoresist composition; 2) the film forming novolak resin solution from e); and 3) additional photoresist solvent, and thereby forming a photoresist composition;
   h) coating a suitable substrate with the photoresist composition from e);
   i) heat treating the coated substrate from f) until substantially all of the photoresist solvent is removed; image-wise exposing the photosensitive composition and removing the image-wise exposed areas of such composition with a suitable developer, such as an aqueous alkaline developer, optionally one may also perform a baking of the substrate either immediately before or after the removing step.

12. The method of claim 11, wherein in step a) said multi-hydroxy benzene is resorcinol, 2-methylresorcinol, 5-methylresorcinol, 2,5-dimethylresorcinol or pyrogallol.

13. The method of claim 11, wherein in step a) said one or more phenolic compounds is one or more of m-cresol, p-cresol, O-cresol, 2,4-dimethylphenol, 2,5-dimethylphenol, 2,3-dimethylphenol, 2,6-dimethylphenol, 3,5-dimethylphenol, 3,4-dimethylphenol, 2,3,5-trimethylphenol or 3,4,5-trimethylphenol.

14. The method of claim 11, wherein the novolak resin block copolymer produced from step a) has the following structure:

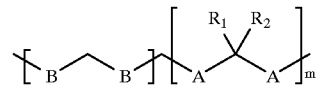

where:
A=pyrogallol, resorcinol 2-methylresorcinol, 5-methylresorcinol, 2,5-dimethyl resorcinol
$R_1$=H
$R_2$=H, $C_1$–$C_3$ alkyl
B=novolak resin, made by condensation of formaldehyde and one or more cresols, selected from m-cresol, p-cresol, o-cresol, 2,4-, 2,5-, 2,3- or 2,6-3,5-, 3,4-dimethylphenol, 2,3,5-, 3,4,5-trimethylphenol, with one or more multi-hydroxy benzen such as resorcinol, 2-methylresorcinol, 5-methylresorcinol, 2,5-dimethylresorcinol or pyrogallol and m is from 1 to 50 weight percent of the novolak resin block copolymer.

15. The method of claim 11, wherein the amount of multihydroxy benzene/ketone or aldehyde is 1 to 50% of the novolak resin block copolymer.

* * * * *